(12) United States Patent
Trivedi et al.

(10) Patent No.: US 10,630,304 B1
(45) Date of Patent: Apr. 21, 2020

(54) SUB-RANGING ANALOG-TO-DIGITAL CONVERTER

(71) Applicant: NXP B.V., Eindhoven (NL)

(72) Inventors: Ronak Prakashchandra Trivedi, Bangalore (IN); Sushil Kumar Gupta, Bangalore (IN); Pankaj Agrawal, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/371,120

(22) Filed: Apr. 1, 2019

(51) Int. Cl.
| H03M 1/06 | (2006.01) |
| H03M 1/00 | (2006.01) |
| H03M 1/12 | (2006.01) |
| H03M 1/10 | (2006.01) |

(52) U.S. Cl.
CPC ............ H03M 1/0602 (2013.01); *H03M 1/00* (2013.01); *H03M 1/001* (2013.01); *H03M 1/06* (2013.01); *H03M 1/10* (2013.01); *H03M 1/12* (2013.01)

(58) Field of Classification Search
CPC ............ H03M 1/06; H03M 1/12; H03M 1/00; H03M 1/001; H03M 1/10
USPC .......................... 341/118, 155, 120, 110, 156
See application file for complete search history.

(56) References Cited

U.S. PATENT DOCUMENTS

| 4,996,530 A * | 2/1991 | Hilton ................... G12B 13/00 341/107 |
| 6,124,818 A | 9/2000 | Thomas et al. |
| 6,583,747 B1 | 6/2003 | van der Goes et al. |
| 7,397,409 B2 | 7/2008 | Jeon et al. |
| 9,503,117 B2 | 11/2016 | Lee et al. |
| 9,813,073 B1 | 11/2017 | Trivedi |

OTHER PUBLICATIONS

Monireh Eslami, Mohammad Taherzadeh-Sani, and Frederic Nabki, "A 1-V 690 µW 8-bit 200 MS/s Flash-SAR ADC with Pipelined Operation of Flash and SAR ADCs in 0.13 µm CMOS", 2015 IEEE International Symposium on Circuits and Systems (ISCAS), IEEE, Lisbon, Portugal, May 24-27, 2015.

Ying-Zu Lin, Chun-Cheng Liu, Guan-Ying Huang, Ya-Ting Shyu, Yen-Ting Liu, and Soon-Jyn Chang, "A 9-Bit 150-MS/s Subrange ADC Based on SAR Architecture in 90-nm CMOS", IEEE Transactions on Circuits and Systems I: Regular Papers, pp. 570-581, vol. 60, Issue No. 3, IEEE, Feb. 11, 2013.

Young-Kyun Cho, Jae-Ho Jung, and Kwang Chun Lee, "A 9-bit 100-MS/s Flash-SAR ADC without Track-and-Hold Circuits", 2012 International Symposium on Wireless Communication Systems (ISWCS), IEEE, Paris, France, Aug. 28-31, 2012.

(Continued)

*Primary Examiner* — Joseph J Lauture

(57) ABSTRACT

A sub-ranging analog-to-digital converter (ADC) converts an analog input signal to a digital output signal. The sub-ranging ADC includes a coarse ADC, a fine ADC, and an error correction circuit (ECC). The fine ADC includes at least three digital-to-analog converters (DACs) that are connected in a pipeline architecture. The coarse and fine ADCs receive the analog input signal in a first half cycle of a clock signal. The coarse ADC converts the analog input signal to a first digital signal in a second half cycle of the clock signal. At least one of the first through third DACs converts the analog input signal to a second digital signal in a full cycle of the clock signal. The ECC receives the first and second digital signals and generates the digital output signal.

20 Claims, 8 Drawing Sheets

(56) References Cited

OTHER PUBLICATIONS

U-Fat Chio, He-Gong Wei, Yan Zhu, Sai-Weng Sin, Seng-Pan U, R. P. Martins, and Franco Maloberti, "Design and Experimental Verification of a Power Effective Flash-SAR Subranging ADC", IEEE Transactions on Circuits and Systems II: Express Briefs, pp. 607-611, vol. 57, Issue No. 8, IEEE, Jun. 28, 2010.

Lin He, Jiaqi Yang, Duona Luo, Lele Jin, Shuangshuang Zhang, Fujiang Lin, Libin Yao, and Xicheng Jiang, "A Speed Enhancing Dual Trial Instantaneous Switching Architecture for SAR ADCs", IEEE Transactions on Circuits and Systems II: Express Briefs, pp. 26-30, vol. 62, Issue No. 1, IEEE, Oct. 14, 2014.

\* cited by examiner

SUB-RANGING ANALOG-TO-DIGITAL CONVERTER

BACKGROUND

The present invention relates generally to analog-to-digital converters (ADC), and, more particularly, to a sub-ranging ADC analog-to-digital converter.

Data converters such as ADCs are commonly used in electronic circuits such as audio and video applications, automotive applications, and the like. The ADCs that are implemented in such applications may be flash ADCs, pipeline ADCs, successive approximation register (SAR) ADCs, or the like. Desirable features of an ADC include high conversion speed, high resolution, and low power consumption. Flash ADCs have a high conversion speed but consume a lot of power and have low resolution. SAR ADCs consume low power and have high resolution compared to flash ADCs, however, SAR ADCs have a low conversion speed. Thus, it is known to combine a flash ADC and a SAR ADC to form a sub-ranging ADC.

A conventional sub-ranging ADC 100 is shown in FIG. 1. The sub-ranging ADC 100 includes a first switch 102, a coarse ADC 104, a thermometer to binary decoder 106 (hereinafter referred to as "decoder 106"), a fixed delay circuit 108, a fine ADC 110, and an error correction circuit (ECC) 112. The ADC 100 converts an analog input signal to a digital output signal. The first switch 102 samples the analog input signal in a sampling phase of an ADC conversion cycle. Thus, the coarse ADC 104 receives the analog input signal via the first switch 102 during the sampling phase. The coarse ADC 104 is a flash ADC that performs coarse conversion to convert the analog input signal to a first digital signal in a unary code format. The first digital signal includes a first set of bits that correspond to most significant bits (MSBs) of the digital output signal.

The decoder 106 receives the first digital signal and converts it from the unary code format to a binary code format. The fixed delay circuit 108 receives the first digital signal and generates a delayed first digital signal.

The fine ADC 110, which is a SAR ADC, also receives the analog input signal and performs fine conversion to convert the analog input signal to a second digital signal. The second digital signal includes a second set of bits that correspond to the least significant bits (LSBs) of the digital output signal. The fine ADC 110 includes second and third switches 114a and 114b, first and second digital-to-analog converters (DACs) 116a and 116b, fourth and fifth switches 118a and 118b, a comparator 120, and a logic circuit 122. The first and second DACs 116a and 116b receive the analog input signal via the second and third switches 114a and 114b during the sampling phase, and also receive the first digital signal from the coarse ADC 104. The first and second DACs 116a and 116b further receive a feedback signal generated by the logic circuit.

The first and second DACs 116a and 116b generate first and second analog signals, respectively. The comparator 120 receives the first and second analog signals by way of the fourth and fifth switches 118a and 118b, respectively, and generates an intermediate signal by comparing the first and second analog signals with a reference signal (not shown). The logic circuit 122 receives the intermediate signal and successively approximates the first and second analog signals to generate the second digital signal and the feedback signal.

The error correction circuit 112 receives the delayed first digital signal and the second digital signal. The LSB of the delayed first digital signal overlaps the MSB of the second digital signal. The error correction circuit 112 compares the LSB of the delayed first digital signal with the MSB of the second digital signal to detect if an error has occurred while generating the digital output signal. If so, the error correction circuit 112 will correct the error and output the digital output signal.

The sub-ranging ADC 100 has two DACs in a pipeline architecture to avoid overlapping of the fine conversions by the first and second DACs 116a and 116b. Thus, the conversion speed as well as the resolution of the digital output signal are low. Further, the coarse and fine conversions are performed in a single phase of the ADC conversion cycle. Hence, a dedicated phase for performing the coarse and fine conversions is absent, which affects the time required to perform the coarse conversion and increases power consumption.

Accordingly, it would be advantageous to have a sub-ranging ADC that provides dedicated phases for coarse and fine conversions and has a higher conversion speed than the conventional sub-ranging ADC.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
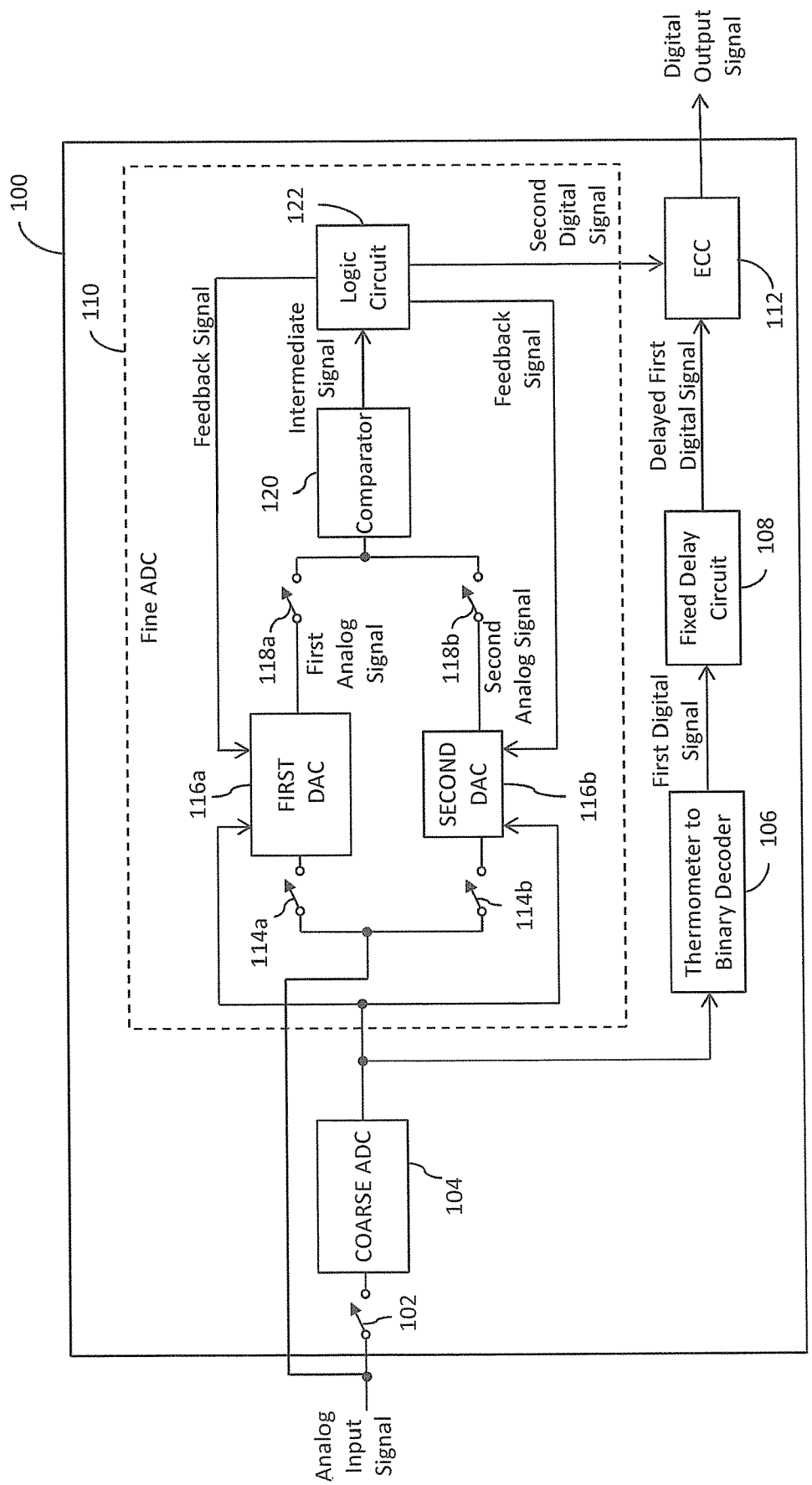
FIG. 1 is a schematic block diagram of a conventional sub-ranging analog-to-digital converter (ADC)

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a sub-ranging ADC that includes a coarse ADC, a fine ADC, and an error corrector circuit. The coarse ADC receives an analog input signal and generates a first digital signal. The coarse ADC receives the analog input signal for at least a first half cycle of a clock signal and generates the first digital signal in at least a second half cycle of the clock signal, where the first and second half cycles are non-overlapping. The fine ADC includes first through third DACs and a conversion circuit. The first through third DACs are connected to the coarse ADC for receiving the first digital signal. The first through third DACs further receive the analog input signal for at least third through fifth half cycles of the clock signal, and generate first through third analog signals, respectively. The second through fifth half cycles are non-overlapping. At least one of the third, fourth, and fifth half cycles overlaps with the first half cycle. The conversion circuit is connected to the first through third DACs for receiving the first through third analog signals, respectively, and generating a second digital signal based on at least one of the first, second, and third analog signals. The error correction circuit is connected to the coarse ADC and the conversion circuit for receiving the first and second digital signals, respectively, and generating a digital output signal.

In another embodiment, the present invention provides a sub-ranging ADC that includes first through third coarse ADCs, a fine ADC, and an error corrector circuit. The first through third coarse ADCs receive an analog input signal and generate first through third digital signals, respectively. The first through third coarse ADCs receive the analog input signal in first through third half cycles of a clock signal, and generate the first through third digital signals in fourth through sixth half cycles of the clock signal, respectively, wherein the first through third half cycles are non-overlapping. The fine ADC is connected to the first through third coarse ADCs. The fine ADC includes first through third DACs and a conversion circuit. The first through third DACs receive the first through third digital signals, respectively, as well as the analog input signal in the first through third half cycles, and generates first through third analog signals, respectively. The conversion circuit is connected to the first through third DACs for receiving the first through third analog signals, respectively. The conversion circuit generates a fourth digital signal based on the first, second, and third analog signals. The error correction circuit is connected to the first through third coarse ADCs for receiving the first through third digital signals, respectively, and connected to the conversion circuit for receiving the fourth digital signal. The error correction circuit generates a digital output signal based on the fourth digital signal and the first, second, and third digital signals.

In yet another embodiment, the present invention provides a method for converting an analog input signal to a digital output signal by an ADC that includes both coarse and fine ADCs. The method includes receiving the analog input signal by the coarse and fine ADCs, where the coarse ADC receives the analog input signal for a first half cycle of a clock signal and the fine ADC receives the analog input signal for second, third, and fourth half cycles of the clock signal. The method further includes generating a first digital signal by the coarse ADC in a fifth half cycle of the clock signal, where the first and fifth half cycles are non-overlapping and the second through fifth half cycles are non-overlapping. The method further includes generating, by the fine ADC, first through third analog signals and a second digital signal. The first through third analog signals are generated using the analog input signal and the first digital signal. The second digital signal is generated using the first, second, and third analog signals. The method further includes generating, by an error correction circuit, the digital output signal based on the first and second digital signals.

Various embodiments of the present invention provide a sub-ranging ADC for converting an analog input signal to a digital output signal. The sub-ranging ADC includes a coarse ADC, a fine ADC, and an error correction circuit. The coarse ADC receives the analog input signal during a first half cycle of a clock signal and converts the analog input signal to a first digital signal in a second half cycle of the clock signal, where the first and second half cycles are non-overlapping. The fine ADC includes first through third DACs that are connected in a pipeline architecture, and a conversion circuit. The first through third DACs receive the analog input signal in third through fifth half cycles of the clock signal, where the first half cycle overlaps with at least one of the third through fifth half cycles. The first through third DACs further receive the first digital signal from the coarse ADC and generate first through third analog signals, respectively. Using the first through third analog signals, the conversion circuit generates a second digital signal in a full cycle of the first clock signal. Further, the error correction circuit generates the digital output signal.

The method and system provide dedicated phases for coarse and fine conversions. That is, a full cycle is dedicated to DAC conversion. Further, the fine ADC has at least three DACs implemented in a pipeline architecture that allows the three DACs to operate in parallel without overlap. Thus, a conversion speed of the DAC and a resolution of the digital output signal are improved as compared to the conventional sub-ranging ADC. For example, in one implementation, an ADC was fabricated that allowed for 8-10 bits conversion at 1 Giga Samples per second (GS/s). Furthermore, the pipelined architecture does not require calibration or interleaving.

Figure 2:
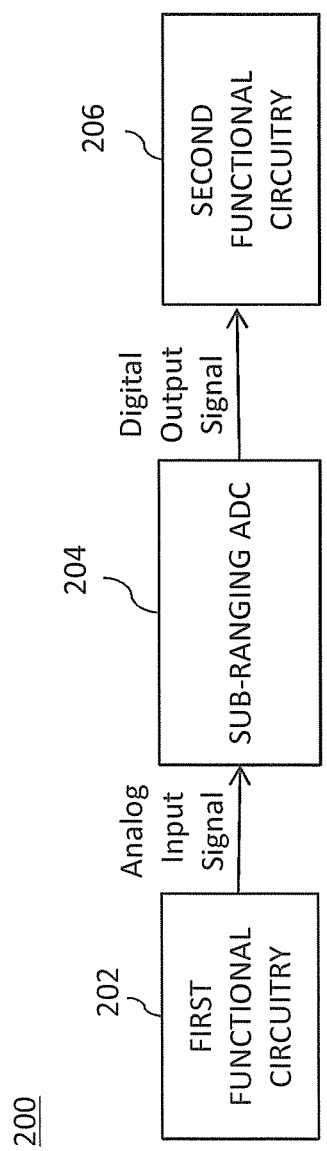
FIG. 2 is a schematic block diagram of a System-on-Chip (SoC) that includes a sub-ranging ADC in accordance with an embodiment of the present invention.

Referring now to FIG. 2, a block diagram of a System-on-Chip (SoC) 200 in accordance with an embodiment of the present invention is shown. The SoC 200 includes first functional circuitry 202, a sub-ranging ADC 204, and second functional circuitry 206. The first functional circuitry 202 may be any analog circuitry that generates an analog signal, which will comprise an analog input signal to the ADC 204.

The sub-ranging ADC 204 is connected to the first functional circuitry 202 for receiving the analog input signal and generating a digital output signal. The sub-ranging ADC 204 may be implemented one of the sub-ranging ADCs 300 and 500 shown in FIGS. 3 and 5, and generates a digital output signal.

The second functional circuitry 206 is connected to the sub-ranging ADC 204 and receives the digital output signal. The second functional circuitry 206 may be any digital circuitry as is typically found in a SoC.

Figure 3:
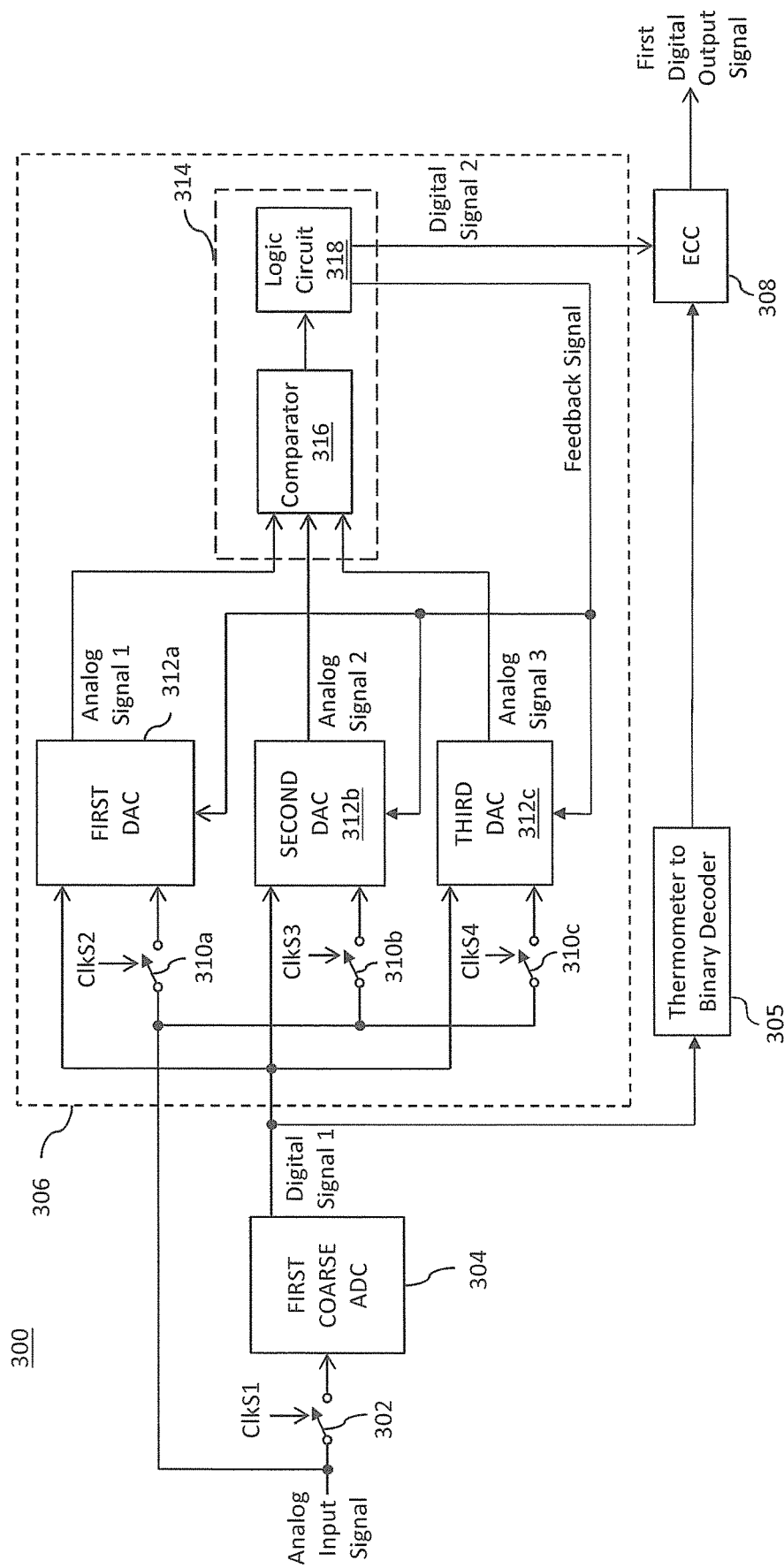
FIG. 3 is a schematic block diagram of the sub-ranging ADC of FIG. 2 in accordance with an embodiment of the present invention.

Referring now to FIG. 3, a block diagram of a sub-ranging ADC 300 in accordance with an embodiment of the present invention is shown. The sub-ranging ADC 300 includes a first switch 302, a first coarse ADC 304, a fine ADC 306, and an error correction circuit 308. The first sub-ranging ADC 300 may further include a clock generator circuit (not shown) that generates a first clock signal CLKS0 (shown in FIG. 4). In one embodiment, the clock generator circuit also generates second through fifth clock signals ClkS1-ClkS4 that are derived from the first clock signal ClkS0. In another embodiment, the first sub-ranging ADC 300 includes second through fifth clock generator circuits (not shown) that receive the first clock signal CLKS0 and generate the second through fifth clock signals ClkS1-ClkS4, respectively.

The first switch 302 receives an analog input signal. In one embodiment, the first switch 302 is internal to the first coarse ADC 304. In another embodiment, the first switch 302 is external to the first coarse ADC 304. The first switch 302 also receives the second clock signal ClkS1. The first switch 302 is active for at least a first half cycle of the first clock signal ClkS0, i.e., the first half cycle corresponds to a time duration for which the second clock signal ClkS1 is high. When the first switch 302 is activated, the first switch 302 samples the analog input signal.

The first coarse ADC 304 receives the analog input signal for at least the first half cycle, i.e., when the first switch 302 is active (closed). The first coarse ADC 304 performs coarse conversion to convert the analog input signal to a first digital signal in at least a second half cycle of the first clock signal ClkS0, where the first and second half cycles of the first clock signal ClkS0 are non-overlapping.

The first coarse ADC 304 may be a flash ADC, a successive approximation register (SAR) ADC, or the like. The first coarse ADC 304 includes a set of comparators (not shown), and each comparator receives the analog input signal and generates a corresponding bit of the first digital signal. The set of comparators thus generate the first digital signal. The first digital signal includes a first set of bits such that the most significant bits (MSBs) of the first digital output signal correspond to the first set of bits. The first coarse ADC 304 further includes a thermometer to binary decoder 305, which is connected to the set of comparators to receive the first digital signal in a unary code format. The decoder 305 converts the first digital signal from the unary code format to a binary code format.

The fine ADC 306 is connected to the first coarse ADC 304 for receiving the first digital signal. The fine ADC 306 also receives the analog input signal. Using the first digital signal and the analog input signal, the fine ADC 306 performs fine conversion to generate a second digital signal in a full cycle of the first clock signal ClkS0. The second digital signal includes a second set of bits such that least significant bits (LSBs) of the first digital output signal correspond to the second set of bits. The fine ADC 306 includes second through fourth switches 310a-310c, first through third DACs 312a-312c, and a conversion circuit 314.

The second through fourth switches 310a-310c receive the analog input signal and the third through fifth clock signals ClkS2-ClkS4, respectively. The second through fourth switches 310a-310c are active (closed) for at least third through fifth half cycles of the first clock signal ClkS0. The third through fifth half cycles are non-overlapping. Further, the third through fifth half cycles correspond to the time durations for which the third through fifth clock signals ClkS2-ClkS4 are high, respectively. The second through fourth switches 310a-310c thus sample the analog input signal in the third through fifth half cycles.

In one embodiment, the second through fourth switches 310a-310c are internal to the fine ADC 306 and external to the first through third DACs 312a-312c, respectively. In another embodiment, the second through fourth switches 310a-310c are external to the fine ADC 306. In yet another embodiment, the second through fourth switches 310a-310c are internal to the first through third DACs 312a-312c, respectively.

The first through third DACs 312a-312c receive the analog input signal for the third through fifth half cycles, i.e., when the second through fourth switches 310a-310c are activate. The first half cycle overlaps with at least one of the third through fifth half cycles. The first DAC 312a receives the analog input signal when the third half cycle overlaps with the first half cycle. The second DAC 312b receives the analog input signal when the fourth half cycle overlaps with the first half cycle. The third DAC 312c receives the analog input signal when the fifth half cycle overlaps with the first half cycle. Each of the first through third DACs 312a-312c further receives the first digital signal and a feedback signal. In one embodiment, the first through third DACs 312a-312c are capacitive DACs including a set of capacitors (not shown). The first digital signal and the feedback signal control charging and discharging of the set of capacitors. Based on the first digital signal, the feedback signal, and the analog input signal, the first through third DACs 312a-312c generate the first through third analog signals, respectively.

The conversion circuit 314 is connected to the first through third DACs 312a-312c and receives the first through third analog signals, respectively. The conversion circuit 314 converts at least one of the first through third analog signals to generate the second digital signal. For controlling the first through third DACs 312a-312c, the conversion circuit 314 generates and provides the feedback signal to the first through third DACs 312a-312c.

The conversion circuit 314 includes a comparator 316 and a logic circuit 318. The comparator 316 is connected to the first through third DACs 312a-312c for receiving the first through third analog signals, respectively. The comparator 316 compares at least one of the first through third analog signals with a reference signal (not shown) to generate a first intermediate signal. As will be understood by those of skill in the art, the reference signal may be generated by a reference signal generator (not shown). The comparator 316 compares the first analog signal at each cycle of a sixth clock signal. The number of cycles for comparison is based on the number of bits of the second digital signal. For example, the comparator 316 performs the comparison for M-cycles of the sixth clock signal when the second digital signal includes M-bits. In one embodiment, the sixth clock signal is generated by the first clock generator circuit.

The logic circuit 318 is connected to the comparator 316 for receiving the first intermediate signal. The logic circuit 318 may comprise a SAR logic circuit that includes SARs and logic gates. The comparator 316 and the logic circuit 318 successively approximate one of the first through third analog signals to generate the second digital signal. The logic circuit 318 generates the first feedback signal using the first intermediate signal at each cycle of the sixth clock signal. After each cycle of the sixth clock signal, the logic circuit 318 generates a corresponding bit of the second digital signal. Thus, after M-cycles of the sixth clock signal, the logic circuit 318 completes generation of the M-bits of the second digital signal.

The error correction circuit 308 is connected to the first coarse ADC 304 by way of the decoder 305 and to the logic circuit 318 for receiving the first and second digital signals, respectively. The error correction circuit 308 compares the LSB of the first digital signal (i.e., the decoded first digital signal) with the MSB of the second digital signal to determine whether the LSB of the first digital signal matches the MSB of the second digital signal. Based on the comparison, the error correction circuit 308 determines whether the first and second digital signals are error-free or erroneous. The first and second digital signals are error-free when the LSB of the first digital signal matches the MSB of the second digital signal, and erroneous when the LSB of the first digital signal does not match the MSB of the second digital signal. The error correction circuit 308 corrects errors in the first and second digital signals when an error is detected. The error correction circuit 308 outputs the first digital output signal based on the first and second digital signals. It will be apparent to a person skilled in the art that the number of bits of the first digital output signal is based on the number of bits of the first and second digital signals. For example, when the first digital signal is N-bits and the second digital signal is M-bits, the first digital output signal will be (N+M−1) bits.

Figure 4:
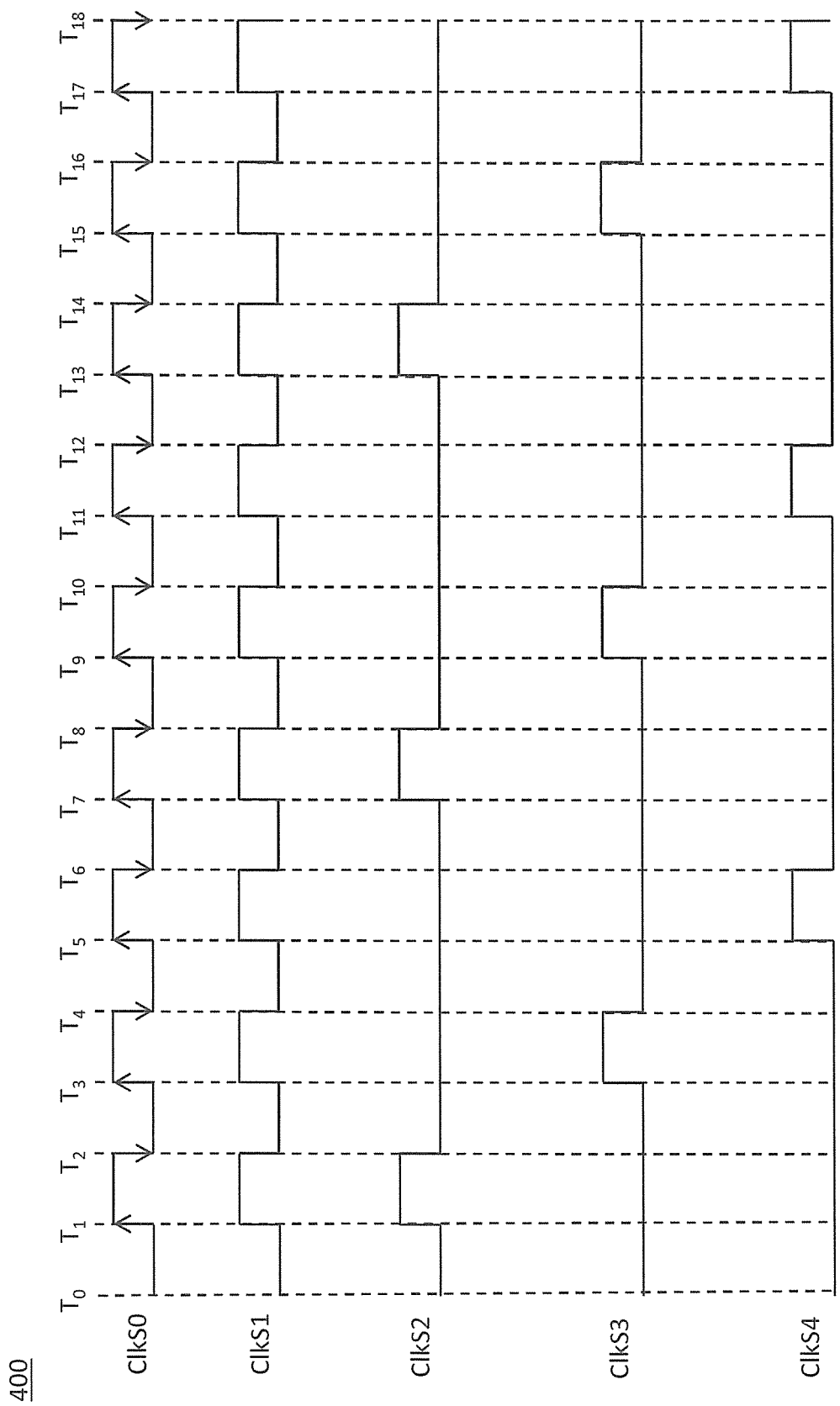
FIG. 4 is a timing diagram that illustrates a sampling operation of the sub-ranging ADC of FIG. 3 in accordance with an embodiment of the present invention.

Referring now to FIG. 4, a timing diagram 400 illustrating a sampling operation of the sub-ranging ADC 300 in accordance with an embodiment of the present invention is shown.

During time period $T_0$-$T_1$, the first through fifth clock signals ClkS0-ClkS4 are low (logic low state).

At time $T_1$, the first, second and third clock signals ClkS0, ClkS1 and ClkS2 transition from low to high and are high during time period $T_1$-$T_2$, while the fourth and fifth clock signals ClkS3 and ClkS4 remain low. The first and second switches 302 and 310a thus sample the analog input signal, so the first coarse ADC 304 and the first DAC 312a receive the analog input signal.

At time $T_2$, the second and third clock signals ClkS1 and ClkS2 go from high to low and at time period $T_2$-$T_3$, the second and third clock signals ClkS1 and ClkS2 remain low, while the fourth and fifth clock signals ClkS3 and ClkS4 also remain low. At this time, the first coarse ADC 304 converts the analog input signal to the first digital signal.

At time $T_3$, the second and fourth clock signals ClkS1 and ClkS3 transition from low to high and during time period $T_3$-$T_4$, the second and fourth clock signals ClkS1 and ClkS3 remain high, and the third and fifth clock signals ClkS2 and ClkS4 remain low. Thus, the first and third switches 302 and 310b are closed so the analog input signal is provided to the first coarse ADC 304 and the second DAC 312b.

At time $T_4$, the second and fourth clock signals ClkS1 and ClkS3 transition from high to low. During time period $T_4$-$T_5$, the second through fifth clock signals ClkS1-ClkS4 remain low. The first coarse ADC 304 generates the first digital signal. During the time period $T_3$-$T_5$, the first digital signal propagates from the first coarse ADC 304 to the first DAC 312a. Thus, the first DAC 312a converts the first digital signal to the first analog signal.

At time $T_5$, the second and fifth clock signals ClkS1 and ClkS4 transition from low to high. During time period $T_5$-$T_6$, the second and fifth clock signals ClkS1 and ClkS4 remain high, and the third and fourth clock signals ClkS2 and ClkS3 remain low. The first and fourth switches 302 and 310c thus pass the analog input signal to the first coarse ADC 304 and the third DAC 312c.

At time $T_6$, the second and fifth clock signals ClkS1 and ClkS4 transition from high to low. During time period $T_6$-$T_7$, the second through fifth clock signals ClkS1-ClkS5 remain low, and the first coarse ADC 304 generates the first digital signal. Further, during time period $T_5$-$T_7$, the first digital signal propagates from the first coarse ADC 304 to the second DAC 312b. The second DAC 312b converts the first digital signal to the second analog signal. The conversion circuit 314 receives the first analog signal and converts the first analog signal to the second digital signal.

At time $T_7$, the second and third clock signals ClkS1 and ClkS2 transition from low to high. During time period $T_7$-$T_8$, the second and third clock signals ClkS1 and ClkS2 remain high, and the fourth and fifth clock signals ClkS3 and ClkS4 remain low. The first and second switches 302 and 310a thus pass the analog input signal to the first coarse ADC 304 and the first DAC 312a.

At time $T_8$, the second and third clock signals ClkS1 and ClkS2 transition from high to low. During time period $T_8$-$T_9$, the second through fifth clock signals ClkS1-ClkS4 remain low, and the first coarse ADC 304 generates the first digital signal. Further, during time period $T_7$-$T_9$, the first digital signal propagates from the first coarse ADC 304 to the third DAC 312c. The third DAC 312c thus converts the first digital signal to the third analog signal. The conversion circuit 314 receives the second analog signal and converts the second analog signal to the second digital signal.

At time $T_9$, the second and fourth clock signals ClkS1 and ClkS3 transition from low to high. During time period $T_9$-$T_{10}$, the second and fourth clock signals ClkS1 and ClkS3 remain high, and the fourth and fifth clock signals ClkS3 and ClkS4 remain low, so the first and third switches 302 and 310b pass the analog input signal to the first coarse ADC 304 and the second DAC 312b.

At time $T_{10}$, the second and fourth clock signals ClkS1 and ClkS3 transition from high to low. During time period $T_{10}$-$T_{11}$, the second through fifth clock signals ClkS1-ClkS4 remain low and the first coarse ADC 304 generates the first digital signal. Further, during time period $T_9$-$T_{11}$, the first digital signal propagates from the first coarse ADC 304 to the first DAC 312a. The first DAC 312a thus converts the first digital signal to the first analog signal. The conversion circuit 314 receives the third analog signal and converts the third analog signal to the second digital signal.

At time $T_{11}$, the second and fifth clock signals ClkS1 and ClkS4 transition from low to high. During time period $T_{11}$-$T_{12}$, the second and fifth clock signals ClkS1 and ClkS4 remain high, and the third and fourth clock signals ClkS2 and ClkS3 remain low. The first and fourth switches 302 and 310c thus pass the analog input signal to the first coarse ADC 304 and the third DAC 312c.

At time $T_{12}$, the second and fifth clock signals ClkS1 and ClkS4 transition from high to low. During time period $T_{12}$-$T_{13}$, the second through fifth clock signals ClkS1-CLkS4 and ClkS4 remain low. The first coarse ADC 304 thus generates the first digital signal. Further, during time period $T_{11}$-$T_{13}$, the first digital signal propagates from the first coarse ADC 304 to the second DAC 312b. The second DAC 312b thus converts the first digital signal to the second analog signal. The conversion circuit 314 receives the first analog signal and converts the first analog signal to the second digital signal.

It will be understood by a person skilled in the art that from $T_{13}$-$T_{18}$ the first switch 302 and the second through fourth switches 310a-310c sample the analog input signal in a manner similar to the sampling of the analog input signal from $T_7$-$T_{12}$.

Figure 5:
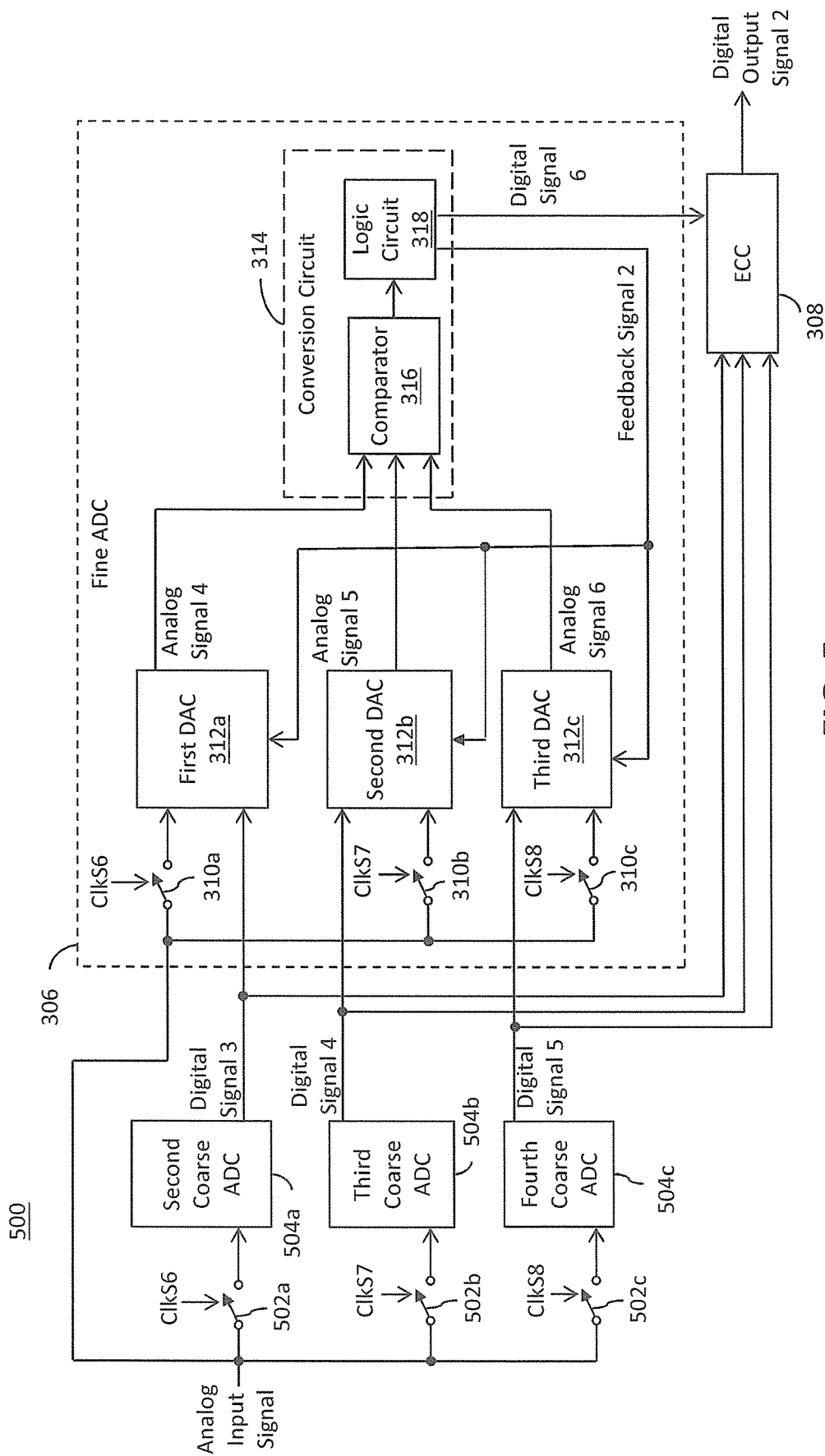
FIG. 5 is a schematic block diagram of the sub-ranging ADC of FIG. 2 in accordance with another embodiment of the present invention.

Referring now to FIG. 5, a block diagram of a sub-ranging ADC 500 in accordance with another embodiment of the present invention is shown. In this embodiment, there are three coarse ADCs instead of just the one in the ADC 300 (FIG. 3), and the fine ADC is the same as in FIG. 3. Thus, the sub-ranging ADC 500 includes fifth through seventh switches 502a-502c, second through fourth coarse ADCs 504a-504c, the fine ADC 306, and the error correction circuit 308.

The fifth through seventh switches 502a-502c receive the analog input signal. In one embodiment, the fifth through seventh switches 502a-502c are internal to the second through fourth coarse ADCs 504a-504c, respectively. In another embodiment, the fifth through seventh switches 502a-502c are external to the second through fourth coarse ADCs 504a-504c, respectively. The fifth through seventh switches 502a-502c receive seventh through ninth clock signals ClkS6-ClkS8 that may be generated by the first clock generator circuit or derived from the first clock signal ClkS0.

The fifth through seventh switches 502a-502c are active for at least sixth through eighth half cycles of the first clock signal ClkS0. In one embodiment, the fifth through seventh switches 502a-502c are active for first through third full cycles of the first clock signal ClkS0, i.e., the first through third half cycles correspond to time durations for which the seventh through ninth clock signals ClkS6-ClkS8 remain high. When the fifth through seventh switches 502a-502c are activated, the fifth through seventh switches 502a-502c sample the analog input signal.

The second through fourth coarse ADCs 504a-504c receive the analog input signal for at least the sixth through eighth half cycles, i.e., when the fifth through seventh switches 502a-502c are active. The second through fourth coarse ADCs 504a-504c convert the analog input signal to third through fifth digital signals in at least ninth through eleventh half cycles of the first clock signal ClkS0, respectively.

The second through fourth coarse ADCs 504a-504c may be flash ADCs, SAR ADCs or the like. In one embodiment, the second through fourth coarse ADCs 504a-504c include fourth through sixth DACs (not shown) and first through third SAR conversion circuits (not shown). In another embodiment, the second through fourth coarse ADCs 504a-504c include a SAR conversion circuit (not shown) and share the first through third DACs 312a-312c with the fine ADC 306. The second through fourth coarse ADCs 504a-504c successively approximate the analog input signal to generate the third through fifth digital signals. The third through fifth digital signals include third through fifth set of bits such that the MSBs of the second digital output signal correspond to the third through fifth set of bits.

The fine ADC 306 is connected to the second through fourth coarse ADCs 504a-504c for receiving the third through fifth digital signals, respectively. The fine ADC 306 also receives the analog input signal. Based on the third through fifth digital signals and the analog input signal, the fine ADC 306 generates a sixth digital signal in a full cycle of the first clock signal ClkS0. The sixth digital signal includes a sixth set of bits, which are the LSBs of the second digital output signal. The fine ADC 306 includes second through fourth switches 310a-310c, first through third DACs 312a-312c, and the conversion circuit 314.

The second through fourth switches 310a-310c receive the seventh through ninth clock signals ClkS6-ClkS8, and are active for at least the sixth through eighth half cycles of the first clock signal ClkS0. The second through fourth switches 310a-310c sample the analog input signal for the first through third full cycles, respectively. The first through third full cycles are non-overlapping.

The first through third DACs 312a-312c receive the analog input signal for at least the sixth through eighth half cycles. Each of the first through third DACs 312a-312c further receives a second feedback signal. The first through third DACs 312a-312c sample the analog input signal to generate fourth through sixth analog signals.

The conversion circuit 314 is connected to the first through third DACs 312a-312c for receiving the first through third analog signals, respectively. The conversion circuit 314 generates the sixth digital signal based on at least one of the third through fifth analog signals. The comparator 316 generates a second intermediate signal and the logic circuit 318 generates the second feedback signal in a manner similar to the generation of the first intermediate signal and the first feedback signal, respectively.

The error correction circuit 308 receives the third through sixth digital signals. The third through sixth digital signals may be decoded and delayed before being provided to the error correction circuit 308. The error correction circuit 308 compares the LSB of one of the third through fifth digital signals with the MSB of the sixth digital signal and outputs the second digital output signal in a manner similar to the first digital output signal.

Figure 6:
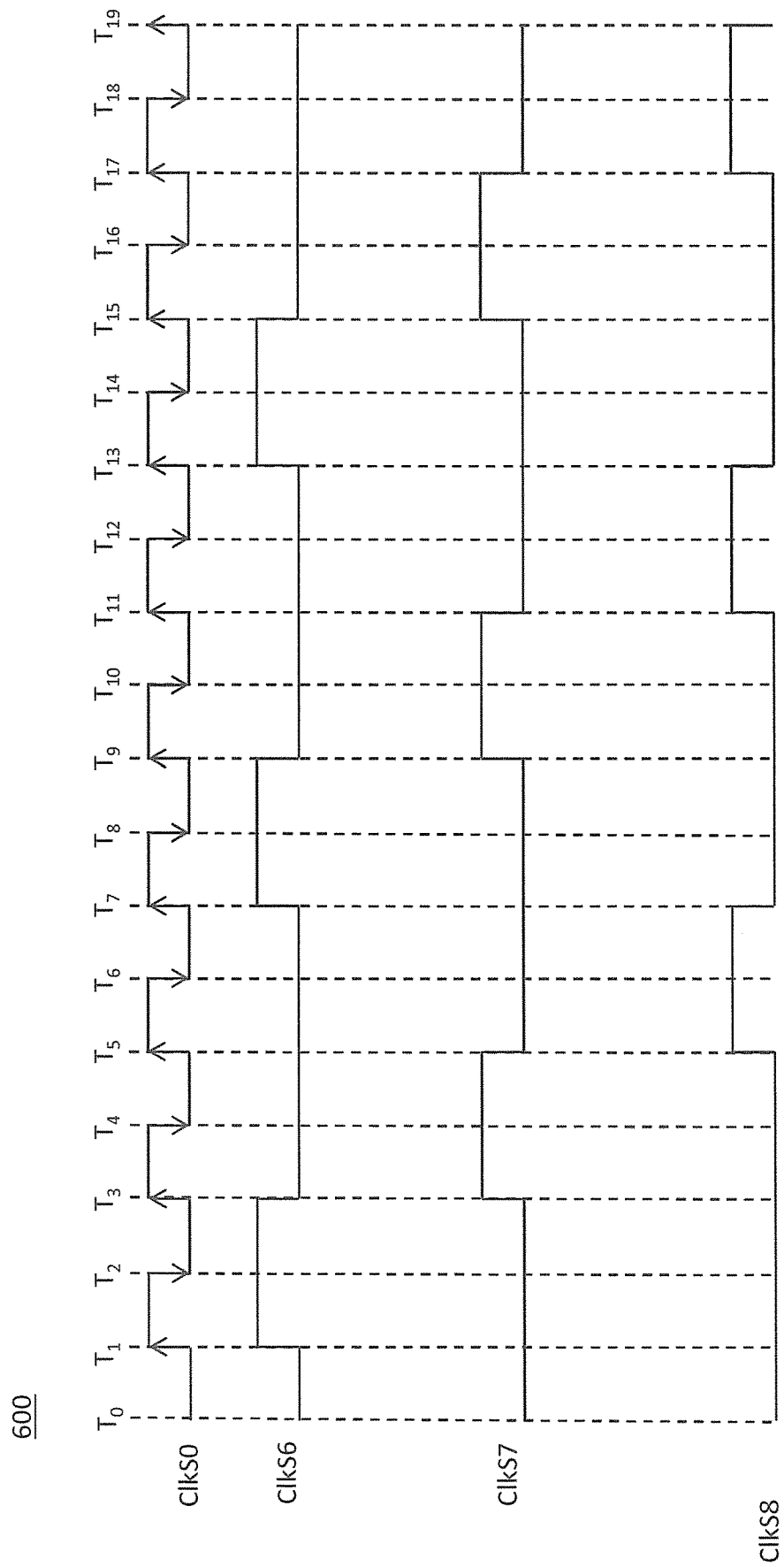
FIG. 6 is a timing diagram that illustrates a sampling operation of the sub-ranging ADC of FIG. 5 in accordance with another embodiment of the present invention.

FIG. 6 is a timing diagram 600 illustrating a sampling operation of the sub-ranging ADC 500 in accordance with an embodiment of the present invention.

During time period $T_0$-$T_1$, the seventh through ninth clock signals ClkS6-ClkS8 are at logic low state.

At time $T_1$, the seventh clock signal ClkS6 transitions from low to high. During time period $T_1$-$T_3$, the seventh clock signal ClkS6 remains high, and the eighth and ninth clock signals ClkS7 and ClkS8 remain low. The fifth and second switches 502a and 310a thus pass the analog input signal to the second coarse ADC 504a and the first DAC 312a.

At time $T_3$, the seventh clock signal ClkS6 transitions from high to low and the eighth clock signal ClkS7 transitions from low to high, and the seventh and ninth clock signals ClkS6 and ClkS8 remain low. During time period $T_3$-$T_5$, the eighth clock signal ClkS7 remains high. The sixth and third switches 502b and 310b thus pass the analog input signal to the third coarse ADC 504b and the second DAC 312b. The second coarse ADC 504a thus converts the analog input signal to the third digital signal.

At time $T_5$, the eighth clock signal ClkS7 transitions from high to low and the ninth clock signal ClkS8 transitions from low to high. During time period $T_5$-$T_7$, the ninth clock signal ClkS8 remains high, and the seventh and eighth clock signals ClkS6 and ClkS7 remain low. The seventh and fourth switches 502c and 310c thus pass the analog input signal to the fourth coarse ADC 504c and the third DAC 312c. The third coarse ADC 504b thus converts the analog input signal to the fourth digital signal. The conversion circuit 314 receives the fourth analog signal and converts the fourth analog signal to the sixth digital signal.

At time $T_7$, the seventh clock signal ClkS6 transitions from low to high. During time period $T_7$-$T_9$, the seventh clock signal ClkS6 remains high, and the eighth and ninth clock signals ClkS7 and ClkS8 remain low. The fifth and second switches 502a and 310a thus pass the analog input signal to the second coarse ADC 504a and the first DAC 312a. The conversion circuit 314 receives the fifth analog signal and converts the fifth analog signal to the sixth digital signal. Further, the fourth coarse ADC 504c converts the analog input signal to the fifth digital signal.

At time $T_9$, the seventh clock signal ClkS6 transitions from high to low and the eighth clock signal ClkS7 transitions from low to high. During time period $T_9$-$T_{11}$, the eighth clock signal ClkS7 remains high and the seventh and ninth clock signals ClkS6 and ClkS8 remain low. The sixth and third switches 502b and 310b thus sample the analog input signal, so the third coarse ADC 504b and the second DAC 312b receive the analog input signal. The second coarse ADC 504a converts the analog input signal to the third digital signal. The conversion circuit 314 receives the sixth analog signal and converts the sixth analog signal to the sixth digital signal.

At time $T_{11}$, the eighth clock signal ClkS7 transitions from high to low and the ninth clock signal ClkS8 transitions from low to high. During time period $T_{11}$-$T_{13}$, the ninth clock signal ClkS8 remains high, and the seventh and eighth clock signals ClkS6 and ClkS7 remain low. The seventh and fourth switches 502c and 310c thus sample the analog input signal, so the fourth coarse ADC 504c and the third DAC 312c receive the analog input signal. The third coarse ADC 504b converts the analog input signal to the fourth digital signal. The conversion circuit 314 receives the fourth analog signal and converts the fourth analog signal to the sixth digital signal.

It will be understood by a person skilled in the art that from $T_{13}$-$T_{18}$ the fifth through seventh switches 502a-502c and the second through fourth switches 310a-310c sample the analog input signal in a manner similar to the sampling of the analog input signal from $T_7$-$T_{12}$.

It will be apparent to a person skilled in the art that when the time duration of sampling the analog input signal is a half cycle of the first clock signal ClkS0, the time duration for the conversion of the analog input signal and the propagation of the third through fifth digital signals is one and a half cycles of the first clock signal ClkS0.

Figure 7:
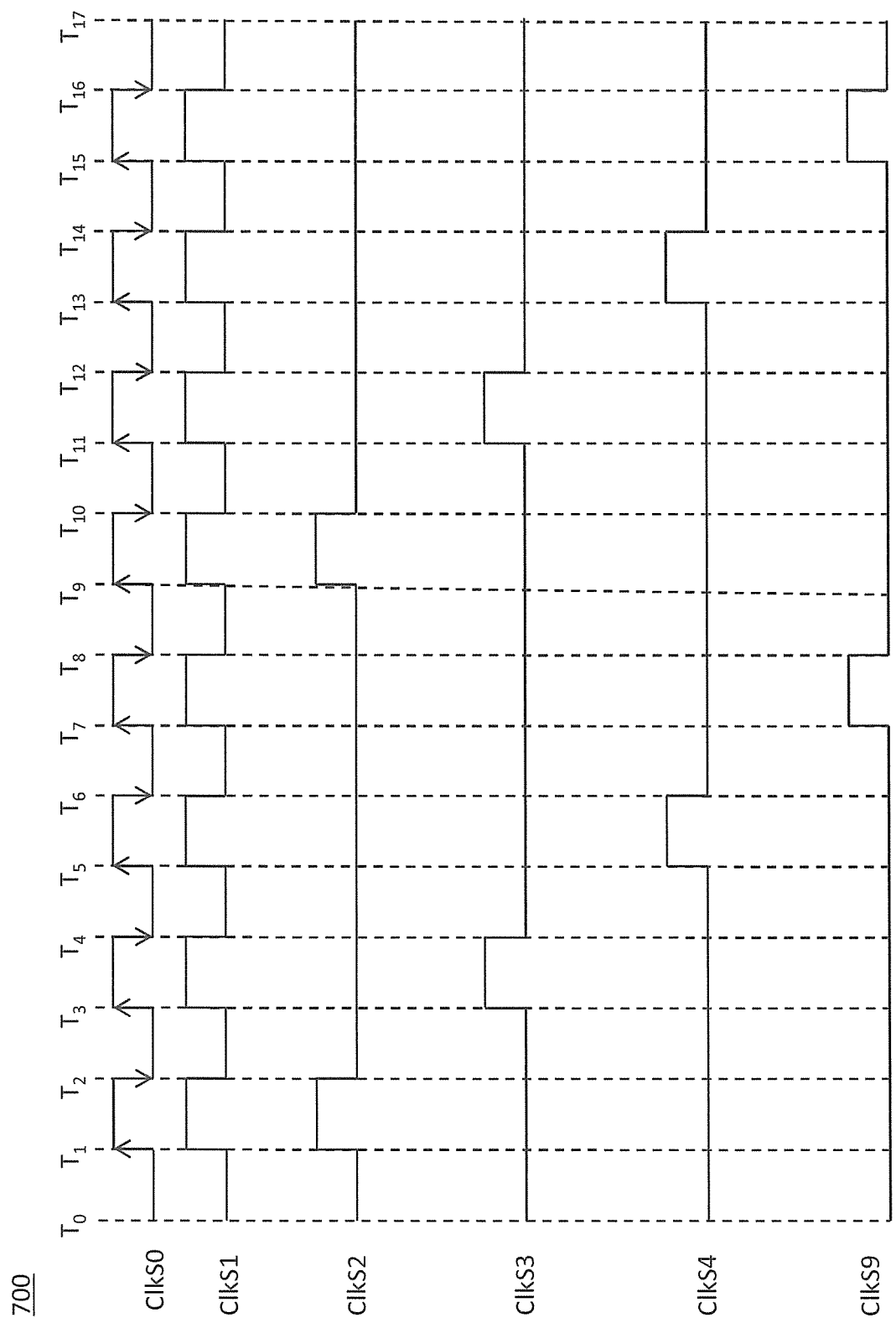
FIG. 7 is a timing diagram that illustrates the sampling operation of the sub-ranging ADC of FIG. 2 in accordance with yet another embodiment of the present invention.

Referring now to FIG. 7, a timing diagram 700 illustrating a sampling operation of the sub-ranging ADC 204 in accordance with yet another embodiment of the present invention is shown, where the sub-ranging ADC 204 is implemented like the sub-ranging ADC 300 shown in FIG. 3, but the fine ADC 306 includes an eighth switch (not shown) and a fourth DAC (not shown) that is connected in a pipeline architecture with the first through third DACs 312a-312c. The eighth switch receives a tenth clock signal ClkS9, which is derived from the first clock signal ClkS0. The fourth DAC is structurally and functionally similar to the first through third DACs 312a-312c. The fourth DAC thus receives the analog input signal when the eighth switch is activated. The fourth DAC further receives the first digital signal and generates a seventh analog signal (not shown).

The time duration for each of the third, fourth, fifth, and tenth clock signals ClkS2, ClkS3, ClkS4, and ClkS9 to transition from low to high corresponds to three and half cycles of the first clock signal ClkS0. Thus, three and half cycles are used by the first sub-ranging ADC 300 for converting the analog input signal to the first digital output signal. Further, as the fine conversion is performed in a full cycle of the first clock signal ClkS0, two and half cycles are used for the coarse conversion of the analog input signal and the propagation of the first digital signal from the first coarse ADC 304 to one of the first through third DACs 312a-312c.

It will further be understood by a person skilled in the art that when the sub-ranging ADC 500 is implemented with four DACs, the time for the coarse conversion is two and a half cycles of the first clock signal ClkS0.

It will further be understood by a person skilled in the art that the number of coarse ADCs required for the coarse conversion in the second sub-ranging ADC 500 is based on the time for the coarse conversion and the number of DACs in the fine ADC 306.

Figure 8:
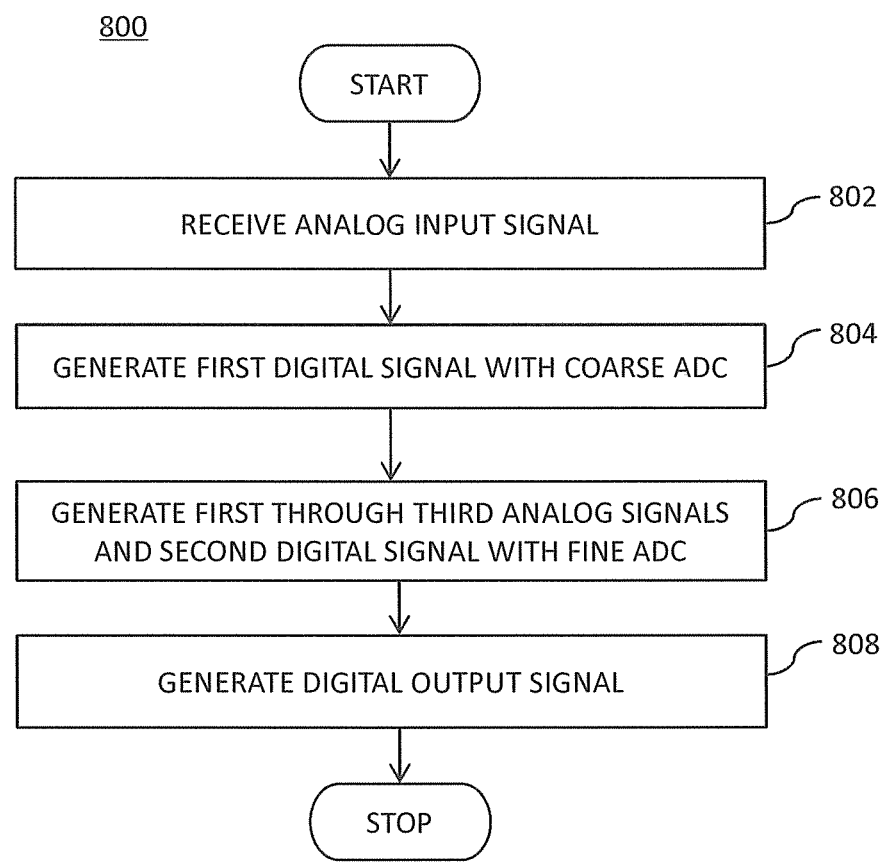
FIG. 8 is a flow chart that illustrates a method for converting an analog input signal to a digital output signal performed by the sub-ranging ADC of FIG. 3 in accordance with an embodiment of the present invention.

Referring now to FIG. 8, a flow chart 800 illustrating a method for converting an analog input signal to a first digital output signal by the sub-ranging ADC 300 in accordance with an embodiment of the present invention is shown.

At step 802, the first sub-ranging ADC 300 receives the analog input signal. The first coarse ADC 304 receives the analog input signal for at least the first half cycle, i.e., when the first switch 302 is active. The first through third DACs 312a-312c of the fine ADC 306 receive the analog input signal for at least the third through fifth half cycles, i.e., when the second through fourth switches 310a-310c are active, respectively. The first half cycle overlaps with at least one of the third through fifth half cycles.

At step 804, the first coarse ADC 304 generates the first digital signal in at least the second half cycle and converts the analog input signal to the first digital signal. The first and second half cycles are non-overlapping and the second through fifth half cycles are non-overlapping.

At step 806, the first through third DACs 312a-312c generate the first through third analog signals, respectively, and the conversion circuit 314 generates the second digital signal.

At step 808, the error correction circuit 308 generates the first digital output signal based on the first and second digital signals.

It will be apparent to a person skilled in the art that the sub-ranging ADC 500 performs the aforementioned steps in a manner similar to the steps performed by the first sub-ranging ADC 300.

Each of the sub-ranging ADCs 300 and 500 have more three or more DACs in a pipeline architecture. Thus, a conversion speed of the ADCs 300 and 500 is faster than the conversion speed of conventional sub-ranging ADCs. Further, due to the higher number of DACs in the first and second sub-ranging ADCs 300 and 500, a resolution of the first and second digital output signals is better than the resolution of the digital output signals of the conventional sub-ranging ADC. In an example, the speed of conversion of the first and second sub-ranging ADCs 300 and 500 is 1 Giga Samples per second (GS/s) and the resolution is 8-12 bits. Further, by providing dedicated phases to the coarse and fine conversions, the first and second sub-ranging ADCs 300 and 500 consume less power than the conventional sub-ranging ADC.

Some conventional ADCs allocate a small window for coarse operation, which is like any other sub-ranging ADC, and this type of allocation is the speed limiting factor for the sub-ranging ADC. In contrast, in the present invention, coarse conversion time is allocated in terms of multiple "half-cycles," which is determined by the number of DACs. This change in timing also provides flexibility to choose any type of ADC for coarse conversion, which is not possible in conventional sub-ranging ADCs, which must use flash memory.

As used herein, the terms "high" and "low" refer to a high logic state and a low logic state, respectively.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A sub-ranging analog-to-digital converter (ADC) that receives an analog input signal and generates a digital output signal, the ADC comprising:
    a coarse ADC that receives the analog input signal and generates a first digital signal, wherein the coarse ADC receives the analog input signal in a first half cycle of a clock signal and generates the first digital signal in at least a second half cycle of the clock signal, and wherein the first and second half cycles are non-overlapping;
    a fine ADC connected to the coarse ADC, wherein the fine ADC comprises:
        first through third digital-to-analog converters (DACs) connected to the coarse ADC for receiving the first digital signal, wherein the first through third DACs further receive the analog input signal for at least third through fifth half cycles of the clock signal, and generate first through third analog signals, respectively, wherein the second through fifth half cycles are non-overlapping, and wherein at least one of the third, fourth, and fifth half cycles overlaps with the first half cycle; and a conversion circuit connected to the first through third DACs for receiving the first through third analog signals, respectively, and generating a second digital signal; and an error correction circuit connected to the coarse ADC and the conversion circuit for receiving the first and second digital signals, respectively, and generating the digital output signal.

2. The sub-ranging ADC of claim 1, further comprising a first switch, wherein the coarse ADC receives the analog input signal by way of the first switch, and wherein the first switch is active for at least the first half cycle of the clock signal.

3. The sub-ranging ADC of claim 2, further comprising second through fourth switches, wherein the first through third DACs receive the analog input signal by way of the second through fourth switches, respectively, and wherein the second through fourth switches are active for at least the third through fifth half cycles of the clock signal, respectively.

4. The sub-ranging ADC of claim 1, wherein the first and second digital signals include first and second sets of bits, respectively, and wherein most significant bits (MSBs) of the digital output signal correspond to the first set of bits, and least significant bits (LSBs) of the digital output signal correspond to the second set of bits.

5. The sub-ranging ADC of claim 1, wherein the first through third DACs are connected in a pipeline architecture.

6. The sub-ranging ADC of claim 1, wherein the conversion circuit further generates a feedback signal for controlling the first through third DACs, and wherein the first through third analog signals are generated using the feedback signal.

7. The sub-ranging ADC of claim 6, wherein the conversion circuit comprises:

a comparator connected to the first through third DACs for receiving the first through third analog signals and generating an intermediate signal using at least one of the first, second, and third analog signals; and a logic circuit connected to the comparator for receiving the intermediate signal, and generating the second digital signal and the feedback signal.

8. The sub-ranging ADC of claim 1, wherein the second digital signal is generated in a full cycle of the clock signal.

9. The sub-ranging ADC of claim 1, wherein:

the conversion circuit generates the second digital signal based on the first analog signal when the third half cycle overlaps with the first half cycle, the conversion circuit generates the second digital signal based on the second analog signal when the fourth half cycle overlaps with the first half cycle, and the conversion circuit generates the second digital signal based on the third analog signal when the fifth half cycle overlaps with the first half cycle.

10. A sub-ranging analog-to-digital converter (ADC) for converting an analog input signal into a digital output signal, the ADC comprising:

first through third coarse ADCs that receive the analog input signal and generate first through third digital signals, respectively, wherein the first through third coarse ADCs receive the analog input signal for at least first through third half cycles of a clock signal, and generate the first through third digital signals in at least fourth through sixth half cycles of the clock signal, respectively, and wherein the first through third half cycles are non-overlapping;

a fine ADC connected to the first through third coarse ADCs, wherein the fine ADC comprises:

first through third digital-to-analog converters (DACs) that are connected to the first through third coarse ADCs for receiving the first through third digital signals, respectively, wherein the first through third DACs further receive the analog input signal for at least the first through third half cycles, and generate first through third analog signals, respectively; and a conversion circuit connected to the first through third DACs for receiving the first through third analog signals, respectively, and generating a fourth digital signal using at least one of the first, second, and third analog signals; and an error correction circuit (ECC) connected to the first through third coarse ADCs for receiving the first through third digital signals, respectively, and to the conversion circuit for receiving the fourth digital signal, wherein the ECC generates the digital output signal using the fourth digital signal and at least one of the first, second, and third digital signals.

11. The sub-ranging ADC of claim 10, further comprising first through third switches, wherein the first through third coarse ADCs receive the analog input signal by way of the first through third switches, respectively, and wherein the first through third switches are active for at least the first through third half cycles of the clock signal, respectively.

12. The sub-ranging ADC of claim 11, further comprising fourth through sixth switches, wherein the first through third DACs receive the analog input signal by way of the fourth through sixth switches, respectively, and wherein the fourth through sixth switches are active for at least the first through third half cycles of the clock signal, respectively.

13. The sub-ranging ADC of claim 10, wherein the first through third digital signals include first through third sets of bits, respectively, and the fourth digital signal includes a fourth set of bits, and wherein most significant bits (MSBs) of the digital output signal correspond to at least one of the first, second, and third sets of bits, and least significant bits (LSBs) of the digital output signal correspond to the fourth set of bits.

14. The sub-ranging ADC of claim 10, wherein the first through third DACs are connected in a pipeline architecture.

15. The sub-ranging ADC of claim 10, wherein the conversion circuit further generates a feedback signal for controlling the first through third DACs, and wherein the first through third analog signals are generated using the feedback signal.

16. The sub-ranging ADC of claim 15, wherein the conversion circuit comprises:

a comparator connected to the first through third DACs for receiving the first through third analog signals, and generating an intermediate signal based on at least one of the first, second, and third analog signals; and a logic circuit connected to the comparator for receiving the intermediate signal and generating the fourth digital signal and the feedback signal.

17. The sub-ranging ADC of claim 10, wherein the fourth digital signal is generated in a full cycle of the clock signal.

18. A method for converting an analog input signal to a digital output signal by a sub-ranging analog-to-digital converter (ADC), wherein the sub-ranging ADC includes a coarse ADC, a fine ADC and an Error Correction Circuit (ECC), the method comprising:

receiving the analog input signal by the coarse and fine ADCs, wherein the coarse ADC receives the analog input signal for at least a first half cycle of a clock signal, and the fine ADC receives the analog input signal for at least one of second, third, and fourth half cycles of the clock signal, and wherein at least one of the second, third, and fourth half cycles overlaps with the first half cycle;

generating a first digital signal by the coarse ADC in a fifth half cycle of the clock signal, wherein the first and fifth half cycles are non-overlapping, and wherein the second through fifth half cycles are non-overlapping;

generating at least first through third analog signals and a second digital signal by the fine ADC, wherein the first through third analog signals are generated using at least the analog input signal and the first digital signal, and the second digital signal is generated using at least one of the first, second, and third analog signals; and generating, by the ECC, the digital output signal using the first and second digital signals.

19. The method of claim 18, wherein the first and second digital signals include first and second sets of bits, respectively, and wherein most significant bits (MSBs) of the digital output signal correspond to the first set of bits and least significant bits (LSBs) of the digital output signal correspond to the second set of bits.

20. The method of claim 18, wherein the second digital signal is generated in a full cycle of the clock signal.

\* \* \* \* \*